(12) United States Patent
Kim

(10) Patent No.: US 6,335,949 B1
(45) Date of Patent: Jan. 1, 2002

(54) NON-LINEAR SIGNAL RECEIVER

(75) Inventor: Yung-soo Kim, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/286,292

(22) Filed: Apr. 6, 1999

(30) Foreign Application Priority Data

Apr. 20, 1998 (KR) .......................................... 98-14052

(51) Int. Cl.$^7$ ................................................ H03H 7/30
(52) U.S. Cl. ........................ 375/232; 375/350; 375/354
(58) Field of Search ................................. 375/231, 232, 375/326, 340, 350, 354; 360/65

(56) References Cited

U.S. PATENT DOCUMENTS

| | | | | |
|---|---|---|---|---|
| 3,651,316 A | * | 3/1972 | Gibson | 375/232 |
| 3,697,689 A | * | 10/1972 | Gibson | 375/373 |
| 5,230,012 A | | 7/1993 | Schenk | |
| 5,606,464 A | * | 2/1997 | Agazzi et al. | 360/46 |
| 6,252,733 B1 | * | 6/2001 | Staszewski | 360/51 |
| 6,266,350 B1 | * | 7/2001 | Ojard et al. | 370/526 |

FOREIGN PATENT DOCUMENTS

EP 0618574 A2 10/1994

* cited by examiner

*Primary Examiner*—Don N. Vo
(74) *Attorney, Agent, or Firm*—Burns, Doane, Swecker & Mathis, L.L.P.

(57) ABSTRACT

A non-linear signal receiver. The non-linear signal receiver for detecting an original data $a_k$ from an input signal r(t) which is a binary data stream input through a channel or reproduced from data recorded on a storing device includes: an analog-to-digital converter (ADC) for sampling the input value according to sampling timing phases, and converting the sampled data into a digital signal $r_k$; a modeling portion including 2N+1 taps $P_n$ (n=−N, . . . , 0, . . . , N) each for selecting one of $2^{\tau+\nu}$ tap values according to each pattern $p_n$ ($b_{k-n+\nu:k-n+1}$, $b_{k-n-1:k-n-\tau}$) of absolute values of the data transitions future $\nu$ bits and past $\tau$ bits, for estimating the channel characteristics of the sampled signal from the selected tap value and the data transition value; a timing recovery portion for controlling the sampling timing phase of the analog-to-digital converter using a phase gradient equal to $p_1(0)-p_{-1}(0)$, which is the difference between values of respective taps positioned symmetrically around the tap $P_0$ of the modeling portion; an equalizer for compensating for the deteriorated characteristics of the output value of the analog-to-digital converter; and a detector for converting the output of the equalizer to a digital value, to detect the original signal. Therefore, an accurate timing phase can be found using a model in which a non-linear channel of a high-density digital magnetic storing device is expressed by transition pulses selected according to the future $\nu$ bits and the past $\tau$ bits, thereby reducing timing jitter and bias.

6 Claims, 4 Drawing Sheets

PHASE DELAY

NON-LINEAR SIGNAL RECEIVER

BACKGROUND OF THE INVENTION

1. Field of the Invention

The present invention relates to a non-linear signal receiver, and more particularly, to a non-linear signal receiver for stably restoring the sampling time of a signal reproduced from a data storage device, taking in consideration non-linear distortion of the signal.

2. Description of the Related Art

In general, non-linearity becomes a serious problem as recording density increases in digital magnetic recording media such as a hard disk drive (HDD). Non-linearity is generated due to interactions between adjacent transitions. A demagnetization field of a previously recorded transition shifts the position of a subsequently recorded transition and increases the width between transitions. The adjacent transitions operate to erase each other. As a result, the amplitude of a reproduced signal is reduced. Such phenomenons are known as a non-linear transition shift (NLTS), a transition broadening, and a partial erasure. Such non-linear distortion adversely affects a series of processes for detecting data from the reproduced signal, and makes it difficult to search an accurate phase of the signal. In case that such non-linear distortion characteristic is not considered, timing jitter and bias become serious.

To solve the problems, U.S. Pat. No. 4,890,299 discloses a method for correcting the sampling phase of a partial-response (PR) signal without causing hangups in which the sampling phase correction is interrupted for a predetermined period of time. However, the method is effective on only linear signals. That is, it is difficult to apply this method to a signal having non-linear distortion. Also, other conventional methods for phase compensation have been based on the assumption that a signal is linear. Thus, these methods cannot be used for a signal having serious non-linear distortion.

SUMMARY OF THE INVENTION

It is an object of the present invention to provide a non-linear signal receiver for modeling signals sampled in consideration of past, current and future bit data, and correcting sampling-timing phase from the phase gradient among the sampled signals.

To achieve the object of the present invention, there is provided a non-linear signal receiver for detecting an original data $a_k$ from an input signal r(t) which is a binary data stream input through a channel or reproduced from data recorded on a storing device, the receiver comprising: an analog-to-digital converter (ADC) for sampling the input value according to sampling timing phases, and converting the sampled data into a digital signal $r_k$; a modeling portion including 2N+1 taps $P_n$ (n=−N, . . . , 0, . . . , N) each for selecting one of $2^{\tau+\nu}$ tap values according to each pattern $p_n$ ($b_{k-n+\nu:k-n+1}$, $b_{k-n-1:k-n-\tau}$) of absolute values of the data transitions future ν bits and past τ bits, for estimating the channel characteristics of the sampled signal from the selected tap value and the data transition value; a timing recovery portion for controlling the sampling timing phase of the analog-to-digital converter using a phase gradient which is the difference between values of respective taps positioned symmetrically around the tap $P_0$ of the modeling portion; an equalizer for compensating for the deteriorated characteristics of the output value of the analog-to-digital converter; and a detector for converting the output of the equalizer to a digital value, to detect the original signal.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
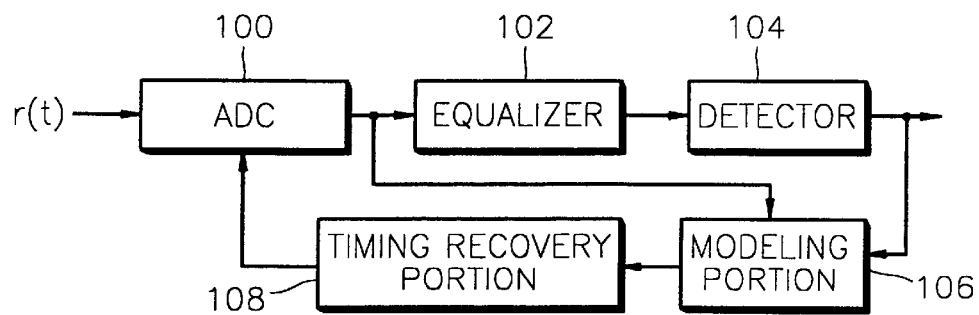
FIG. 1 is a block diagram of a non-linear signal receiver according to the present invention.

Referring to FIG. 1, a non-linear signal receiver according to the present invention includes an analog-to-digital converter (ADC) 100, an equalizer 102, a detector 104, a modeling portion 106 and a timing recovery portion 108.

The ADC 100 samples an analog signal r(t) received through a channel or reproduced from a data storage device, and converts the analog signal into a digital signal $r_k$. The equalizer 102 compensates for the deteriorated characteristics of the input signal $r_k$, and the detector 104 compares the output value of the equalizer 102 with a predetermined value to output a digital value. The modeling portion 106 does modeling on a channel using the output value of the detector 104 and the previously known data. The timing recovery portion 108 calculates a timing phase gradient from two of a plurality of tap values of the modeling portion 106, and corrects a sampling-timing phase using the calculated gradient value.

Figure 2:
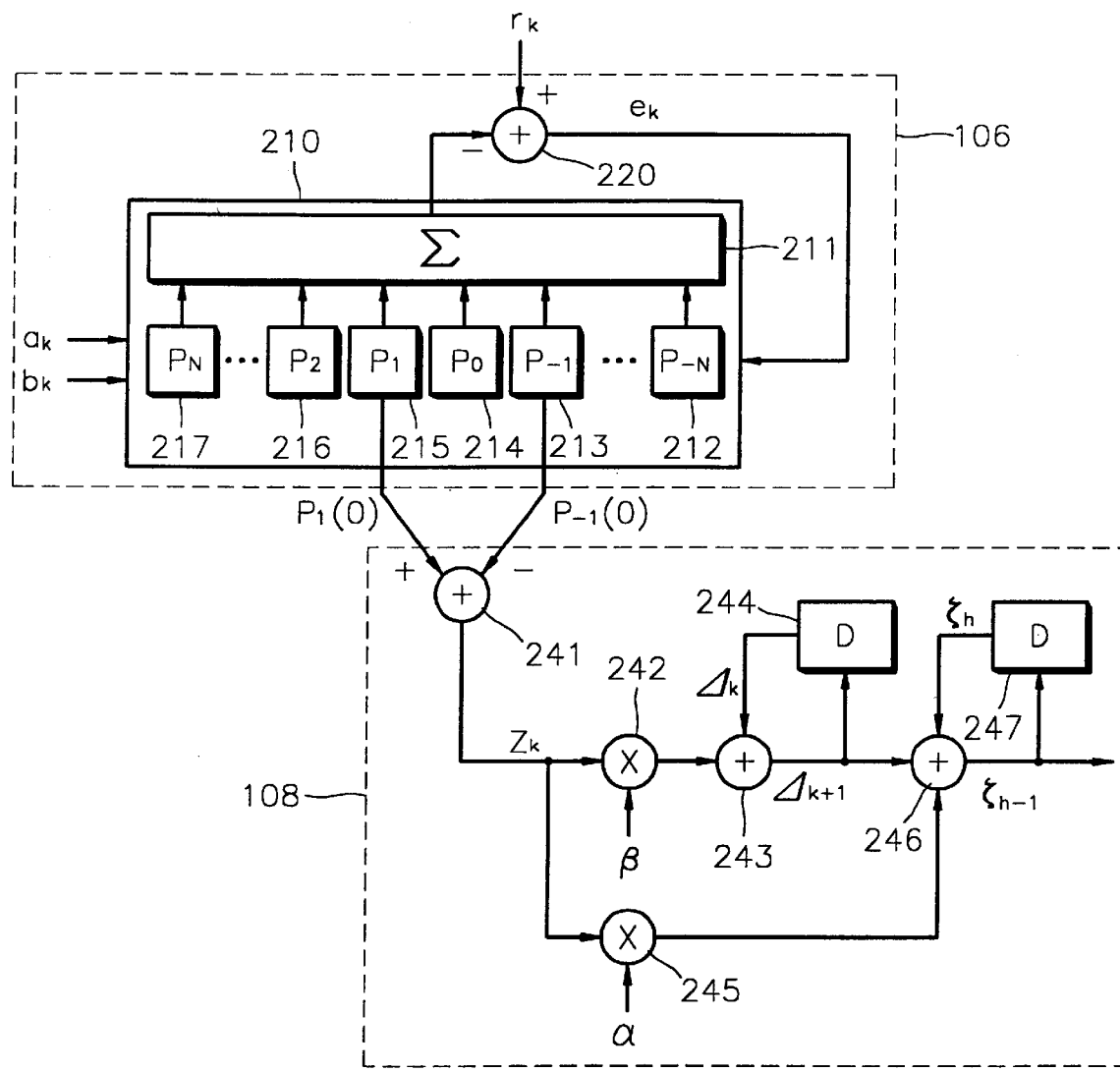
FIG. 2 is a detailed block diagram of the modeling portion and the timing recovery portion of FIG. 2.

FIG. 2 shows the modeling portion 106 and the timing recovery portion 108 of FIG. 1 in detail. The modeling portion 106 includes a non-linear filter 210 and an adder 220. The non-linear filter 210 comprises a plurality of taps ($P_{-N}$, . . . , $P_{-1}$, $P_0$, $P_1$, . . . , $P_N$) 212 through 217, and a first adder 211. The timing recovery portion 108 comprises a second adder 241, a first multiplier 242, a third adder 243, a first delay 244, a second multiplier 245, a fourth adder 246 and a second delay 247.

The modeling portion 106 operates as follows.

After a binary data stream $a_k$ ($a_k$ is +1 or −1) is recorded on a data storage device and then reproduced therefrom, or received through a channel, a sampled signal $r_k$ from the binary data stream is modeled in a pulse $p_n(\cdot)$ which varies according to data patterns, through the plurality of taps of the non-linear filter 210 as follows. A difference $e_k$ between the product of the modeled signal $p_n(\cdot)$ and a predetermined data $x_{k-n}$ and the input signal $r_k$ is calculated by the adder 220 according to the Equation (1).

$$e_k = r_k - \sum_{n=-N}^{N} x_{k-n} p_n(b_{k-n+\nu:k-n+1}, b_{k-n-1:k-n-\tau}) \qquad (1)$$

In Equation (1), $x_k$=($a_k$−$a_{k-1}$)/2=−1, 0 or +1; $x_k$=−1 indicates the negative transition of data, $x_k$=0 indicates no transition, and $x_k$=+1 indicates positive transition of data. Also, $b_k$=|$x_k$|=1 or 0; $b_k$=1 indicates that there is an occurrence of a transition and $b_k=0$ means there is not an occurrence of a transition. $b_{k-1:k-\tau}$ represents $\tau$ data sets ($b_{k-1}$, $b_{k-2}$, ..., $b_{k-\tau}$) and a pulse $p_n$ ($b_{k-n+v:k-n+1}$, $b_{k-n-1:k-n-\tau}$) has a value which varies according to the states of the transition $b_{k-n+v:k-n+1}$ of future $v$ bits and the transition $b_{k-n-1:k-n-\tau}$ of past $\tau$ bits in the respective samples n.

The data $a_k$ and $b_k$ input to the non-linear filter 210 are known data when the equalizer is trained and the data detected in advance during a detection of data.

$p_n(\cdot)$ of Equation (1) can be expressed as Equation (2) by substituting a pattern state value $s_k$.

$$p_n(b_{k-n+v:k-n+1}, b_{k-n-1:k-n-\tau}) = \sum_{m=0}^{M-1} \delta(m - s_{k-n}) p_n(m) \quad (2)$$
$$= \hat{i}_{k-n}^t \hat{p}_n$$

In Equation (2), $\delta(m-s_{k-n})$ is a delta function which has a value of 1 when m is equal to $s_{k-n}$ and a value of 0 when m is not equal to $s_{k-n}$, ^ indicates vector representation and t indicates the transpose. Also, M is the number of pulses $p_n(\cdot)$, which is equal to $2^{\tau+v}$, and $s_{k-n}$, $\hat{i}_{k-n}$ and $\hat{p}_n$ are respectively expressed as the Equations (3), (4) and (5).

$$s_{k-n} = \sum_{m+1}^{v} b_{k-n+m} 2^{\tau+m-1} + \sum_{m=1}^{\tau} b_{k-n-m} 2^{\tau-m} \quad (3)$$

$$\hat{i}_{k-n} = [\delta(s_{k-n})\delta(s_{k-n}-1) \ldots \delta(s_{k-n}-M+1)]^t \quad (4)$$

$$\hat{p}_n = [\hat{p}_n(0)\hat{p}_n(1) \ldots \hat{p}_n(M-1)]^t \quad (5)$$

In Equation (2), the pulse $p_n$ ($b_{k-n+v:k-n+1}$, $b_{k-n-1:k-n-\tau}$) is the product of two vectors each of size M. Also, $e_k$ of Equation (1) can be expressed as Equation (6) from Equation (2).

$$e_k = r_k - \sum_{n=-N}^{N} x_{k-n} \hat{i}_{k-n}^t \hat{p}_n \quad (6)$$
$$= r_k - \sum_{n=-N}^{N} \hat{w}_{k-n} \hat{p}_n$$
$$= r_k - \tilde{w}_k \tilde{p}$$

In Equation (6), $\hat{w}_{k-n}$, $\tilde{w}_k$ and $\tilde{p}$ are respectively expressed as Equations (7), (8) and (9).

$$\hat{w}_{k-n} = x_{k-n} \hat{i}_{k-n}^t \quad (7)$$

$$\tilde{w}_k[\hat{w}_{k+N} \hat{w}_{k-1+N} \ldots \hat{w}_{k-N}] \quad (8)$$

$$\tilde{p}[\hat{p}_{-N}^t \hat{p}_{1-N}^t \ldots \hat{p}_N^t]^t \quad (9)$$

When $s_{k-n}$ is equal to 0, transitions do not occur in future $v$ bits and past $\tau$ bits on the basis of the current data $a_{k-n}$. Then, an optimal pulse $\tilde{p}$ minimizing the mean square of the modeling error is obtained by Equation (10).

$$\tilde{p} = E\{\tilde{w}_k^t \tilde{w}_k\}^{-1} E\{\tilde{w}_k^t r_k\} \quad (10)$$

In Equation (10), $E\{\cdot\}$ indicates mean operation. The optimal pulse $\tilde{p}$ can adaptively be calculated as Equation (11).

$$\tilde{p} = \tilde{p} + \mu e_k \tilde{w}_k \quad (11)$$

In Equation (11), $\mu$ indicates step size.

Equation (11) may be expressed in detail as Equation (12).

$$p_n(i) = p_n(i) + \mu e_k x_{k-n} \delta(s_{k-n}-i) \quad (12)$$

In Equation (12), n=-N, ..., N and i=0, ..., M-1.

Thus, the pulse $p_n(\cdot)$ is updated only in the case where $x_{k-n}$ is not equal to 0 and $s_{k-n}=1$, and is maintained as the previous value in the other case.

Figure 3A:
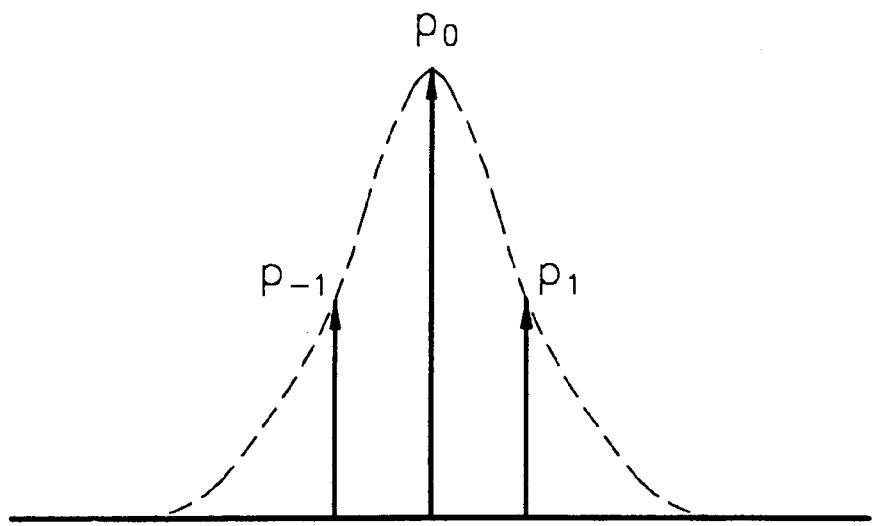
FIGS. 3A and 3B are graphs showing pulse samples according to timing phases.

The pulses do modeling on the channel characteristics of the sampling signal. Most channels from the hard disk drive (HDD) show nearly symmetric channel response. However, if the sampling phase is not precise, the pulses are asymmetric in the same analog signal. FIG. 3A shows the case where there is no phase difference between the pulses $P_1$ and $P_{-1}$ due to the precise sampling phase, and FIG. 3B shows the case where a phase difference between the pulses $P_1$ and $P_{-l}$ exists due to the phase delay caused by an inaccurate sampling phase.

Figure 3B:
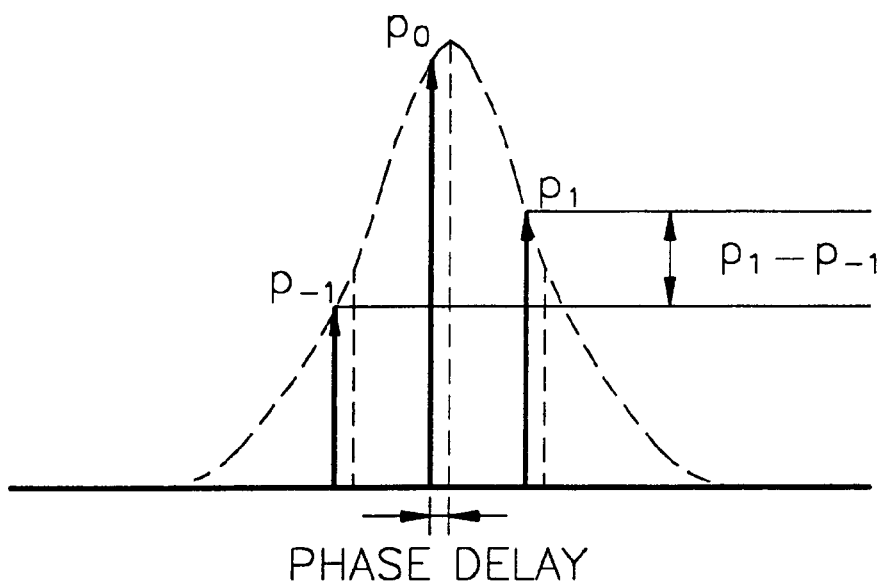

Thus, if the sampling phase is not precise as in FIG. 3B, the phase difference must be corrected. The phase correction is achieved by the timing recovery portion 108. The timing recovery portion 108 corrects the phase difference by using a timing phase information indicating the position of a pulse to be sampled from an asymmetrical pulse of the data pattern on which the non-linear effect is the least. Such correction is performed as follows.

First, a phase gradient $z_k$ is calculated by the second adder 241 input from the taps $P_1$ and $P_{-1}$ of the non-linear filter 210, which is expressed as Equation (13).

$$z_k = p_1(0) - p_{-1}(0) \quad (13)$$

A frequency difference $\Delta_{k+1}$ between the input signal and a local timing source is calculated by the first multiplier 242, the third adder 243 and the first delay 244, and a timing phase $\xi_{k+1}$ is calculated by the second multiplier 245 and the fourth adder 246 and the second delay 247, using the phase gradient $z_k$, which are expressed as Equation (14).

$$\Delta_{k+1} = \Delta_k + \beta \cdot z_k$$
$$\xi_{k+1} = \xi_k + \alpha \cdot z_k + \Delta_{k+1} \quad (14)$$

In Equation (14), the phase gradient $z_k$ is equal to 0 when a pulse is symmetrical, and $\alpha$ and $\beta$ represent step sizes.

When the data stored in a data storage device is reproduced by a magneto-resistive (MR) head, the reproduced signal has different characteristics according to its positive direction or its negative direction. For example, it is possible to consider the characteristic of the signal which varies according to the directions by adding the state of the current data to the pattern of the pulse. Namely, according to the added current data $a_k$, the pulse is redefined as $p_n(b_{k-n+v:k-n+1}, c_k, b_{k-n-1:k-n-\tau})$ and variables $c_k$, M, and $s_k$ are redefined as Equation (15).

$$c_k = \begin{cases} 1, & \text{if } a_k > 0 \\ 0, & \text{otherwise} \end{cases} \quad (15)$$

$$M = 2^{\tau+v+1}$$

$$s_{k-n} = c_{k-n} 2^\tau + \sum_{m=1}^{v} b_{k-n+m} 2^{\tau+m} + \sum_{m+1}^{\tau} b_{k-n-m} 2^{\tau-m}$$

The other equations are the same as those mentioned before.

Figure 4:
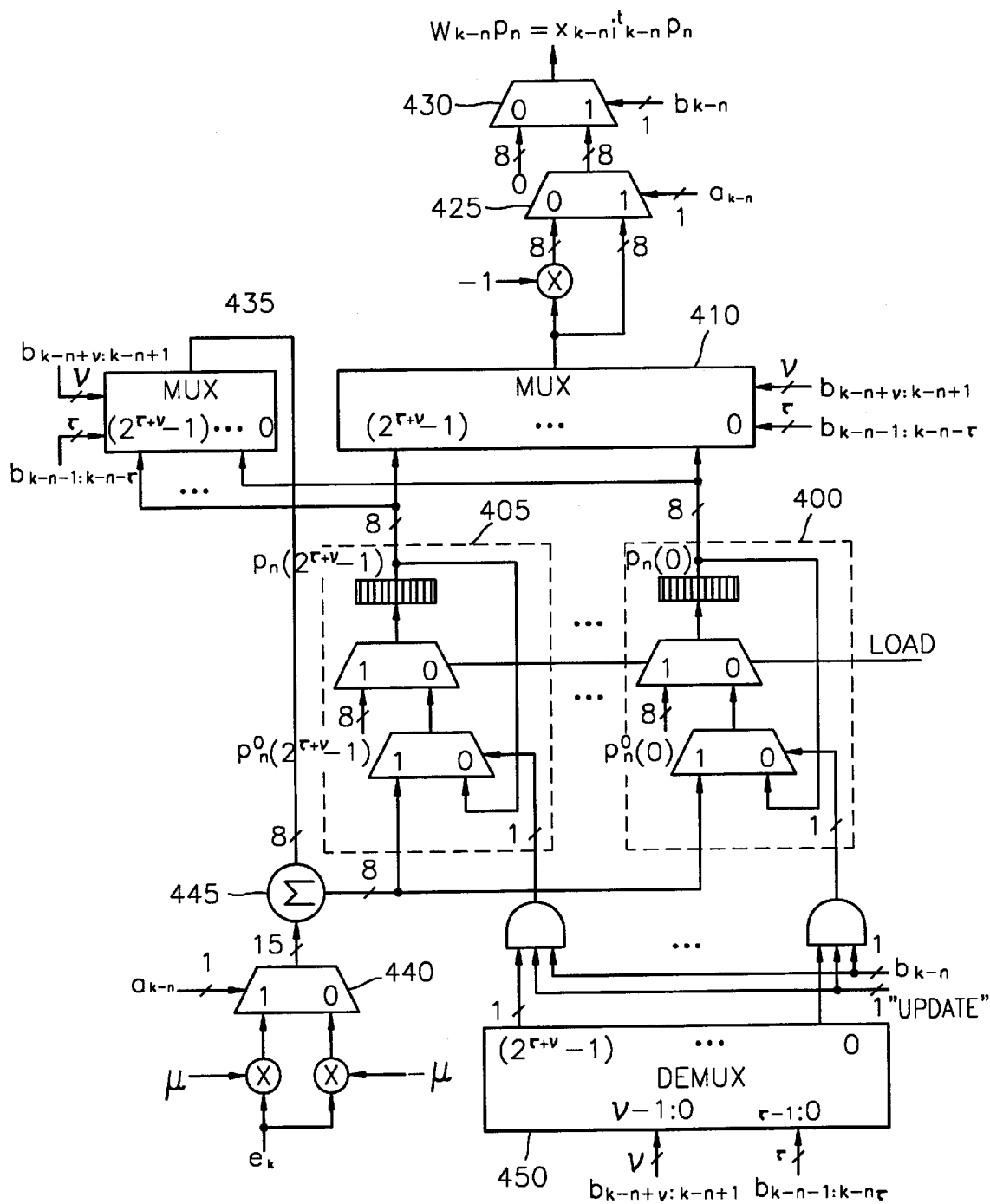
FIG. 4 shows an example of the nth filter tap ($P_n$, wherein n=−N, . . . , 0, . . . , N) of FIG. 2.

FIG. 4 shows an example of the nth filter tap $P_n$ (where n=-N, ..., 0, ..., N) of FIG. 2. As shown in FIG. 4, the nth filter tap $P_n$ (where n=-N, ..., 0, ..., N) having different tap values according to data patterns is constituted as follows. The nth filter tap $P_n$ outputs a value of $\hat{w}_{k-n}\hat{p}_n$.

Buffers $p_n(i)$ (where $i=0, 1, \ldots, 2^{\tau+\nu}-1$) store tap values with respect to each pattern. An initial value $p_n{}^0(i)$ (where $i=0, 1, \ldots, 2^{\tau+\nu}-1$) is designated when a control signal LOAD is on at the initial stage of the operation. In FIG. 4, reference numerals 400 and 405 represent the 0th and ($2^{\tau+\nu}-1$)th buffers, respectively.

A tap value multiplexer 410 receives the pattern $b_{k-1-n:k-\tau-n}$ of the past $\tau$ bit transition absolute value and the pattern $b_{k-n--\nu:k-n+1}$ of the future $\nu$ bit transition absolute value, to output one among the buffer values $p_n(i)$ (where $i=0, 1, \ldots, 2^{\tau+\nu}-1$) of $2^{\tau+\nu}$. The result corresponds to the operation $\hat{i}_{k-n}{}^t\hat{p}_n$ of Equation (3).

A sign selector 425 and a current transition presence selector 430 provide the same result as the product of the output value $\hat{i}_{k-n}{}^t\hat{p}_n$ of the tap value multiplexer 410 and $x_{k-n}$. The sign selector 425 selects the output value of the tap value multiplexer 410 when $a_{k-n}$ is 1 and the product of the output value of the tap value multiplexer 410 and $-1$ when $a_{k-n}$ is 0. The above process is the same as the process of multiplying $x_{k-n}$ with the output value of the tap value multiplexer 410 under the assumption that $b_{k-n}=1$. Then, the current transition presence selector 430 selects either the output value of the sign selector 425 or 0 according to $b_{k-n}$.

As a result, the output value of the current transition presence selector 430 is $\hat{w}_{k-n}\hat{p}_n=\hat{x}_{k-n}\hat{i}_{k-n}{}^t\hat{p}_n$, which is the output value of the nth filter tap $P_n$.

Simultaneously, the nth filter tap $P_n$ updates the tap value according to Equation (12) using the error $e_k$.

An updated tap value multiplexer 435 selects one among the output values of the buffers $P_n(i)$ (where $i=0, 1, \ldots, 2^{\tau+1}-1$) according to the input values of the future $\nu$ bit transition $b_{k-n+\nu:k-n+1}$ and the past $\tau$ bit transition $b_{k-n-1:k-n-\tau}$. Then, an increased/reduced value calculator 440 receives $a_{k-n}$, $\mu$ and the error $e_k$ to calculate $\mu a_{k-n} e_k$, and the updated tap value calculator 445, an adder, adds $\mu a_{k-n} e_k$ to the output value of the updated tap value multiplexer 435.

An updated tap value demultiplexer 450 receives the future $\nu$ bit transition $b_{k-n+\nu:k-n+1}$ and the past $\tau$ bit transition $b_{k-n-1:k-n-\tau}$ and outputs $2^{\tau+\nu}$ values. Here, only one of the output ports of the updated tap value demultiplexer 450 have a value of 1, and the remaining output ports of $2^{\tau+\nu}-1$ have a value of 0. That is, the updated tap value demultiplexer 450 selects one among the $2^{\tau+\nu}$ buffers $p_n(i)$ (where $i=0, 1, \ldots, 2^{\tau+1}-1$) according to the future $\nu$ bit transition $b_{k-n+\nu:k-n+1}$ and the past $\tau$ bit transition $b_{k-n-1:k-n-\tau}$. When a control signal UPDATE is high and $b_{k-n}$ is 1, the output value of the updated tap value calculator 445 is provided to the selected buffer. When the control signal UPDATE is low or $b_{k-n}$ is 0, the original tap value is maintained.

Figure 5:
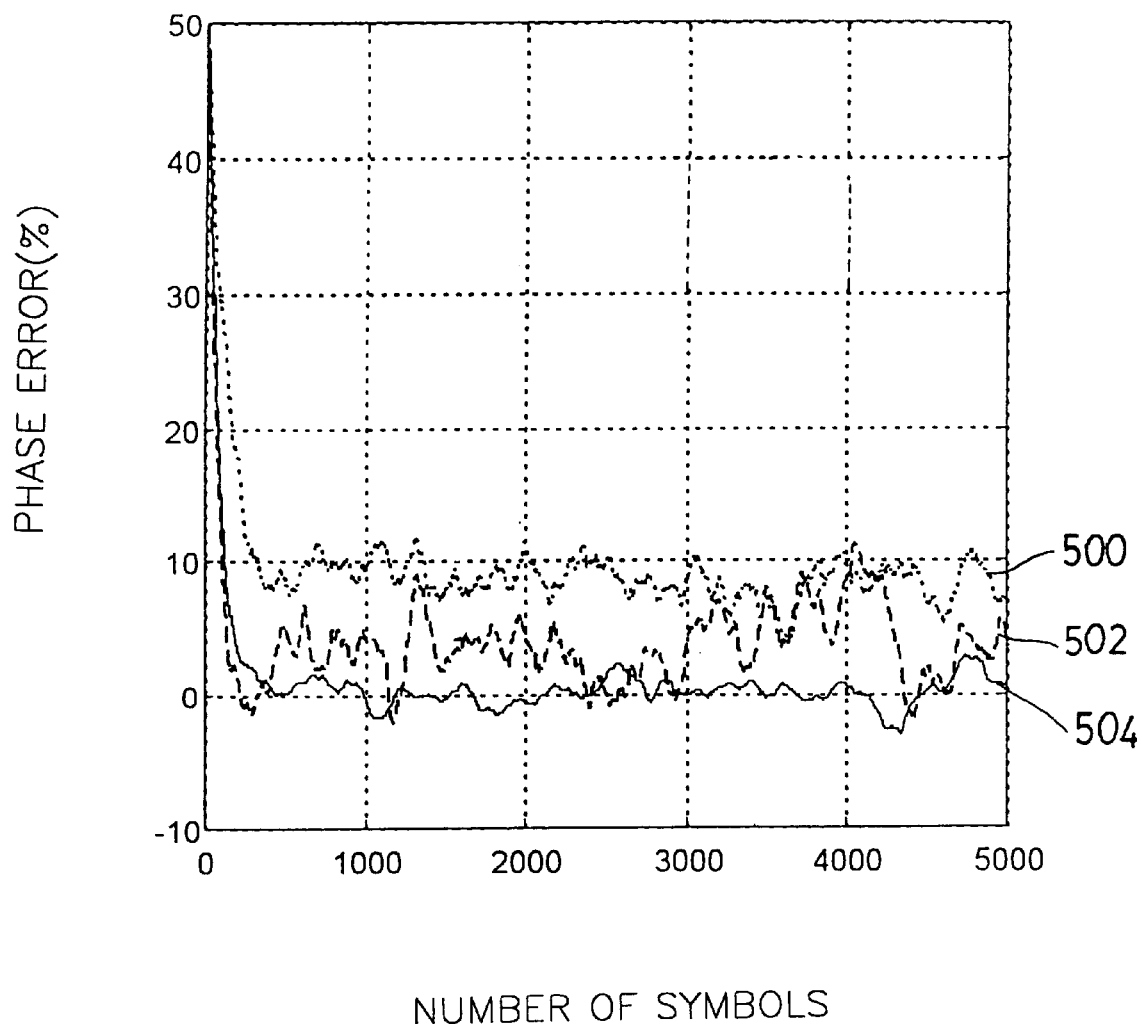
FIG. 5 shows the results of a simulated phase correction using the non-linear signal receiver according to the present invention.

FIG. 5 shows the results of the phase correction by the non-linear signal receiver according to the present invention, which is obtained through simulation. A non-linear signal used in the simulation is as follows.

First, a channel data $r_k$ for testing the performance of the present invention is generated by Equation (16). The channel signal $r_k$ with respect to the binary data $a_k(=+1$ or $-1)$ and $x_k=(a_k-a_{k-1})/2$ obtained by encoding a random binary data stream using RLL(0,4/4) are the sum of data $x_k$ affected by a gain $g_k$ and the phase $\epsilon_k$ of the pulse h(t), and white Gaussian noise $n_k$.

$$r_k = \sum_{m=-N}^{N} x_{k-m} g_{k-m} h(mT + \epsilon_{k-m}) + n_k \qquad (16)$$

In Equation (16), T indicates sampling period.
Here, the pulse h(t) is expressed as Equation (17).

$$h(t) = [1 + (2t/pw_{50})^2]^{-1} \qquad (17)$$

In the equation (17), $pw_{50}$ is supposed to have the value of $2.5\times(9/8)$. The amplitude of the noise added is defined by Equation (18).

$$SNR_{mfb} = E\{[h(kT)-h(kT-T)]^2\}/E\{n^2_k\} \qquad (18)$$

In Equation (18), $E\{\cdot\}$ indicates mean operation.
Changes in gain and pulse phase according to the presence of data transition are shown in the following Tables 1 and 2.

TABLE 1

| $b_{k-1}$ | $b_{k+1}$ | $g_k$ |
|---|---|---|
| 0 | 0 | 1 |
| 0 | 1 | $\gamma$ |
| 1 | 0 | $\gamma$ |
| 1 | 1 | $\gamma^2$ |

TABLE 2

| $b_{k-1}$ | $\epsilon_k/T$ |
|---|---|
| 0 | 0 |
| 1 | 0.5 |

As shown in FIG. 5, the initial phase error of the non-linear signal described above was 50% and the phase error decreased with the passing of time. A plot indicated by reference numeral 500 corresponds to the case of using a linear pulse of $\nu=0$, $\tau=0$ and $N=1$ (N represents the size of filter taps), and a plot indicated by reference numeral 502 corresponds to the case of using a linear pulse of $\nu=0$, $\tau=0$ and $N=6$. In both cases of using the linear pulse, a bias of a timing phase exists, so that timing jitter is considerably great. Also, a plot indicated by reference numeral 504 corresponds to the case of using a pattern dependent pulse of $\nu=1$, $\tau=1$ and $N=1$, in which there is no bias of the timing phase and the jitter is relatively small.

As described above, in the non-linear signal receiver according to the present invention, an accurate timing phase can be found using the model in which a non-linear channel of a high-density digital magnetic storing device is expressed as transition pulses selected according to the future $\nu$ bits and the past $\tau$ bits, thereby reducing timing jitter and bias. Also, by selecting $\tau$, $\nu$ and N of the pulse model, the performance and complexity in correction of timing phase can appropriately be traded off. Also, a hangup phenomenon in which the sampling phase correction is interrupted for a predetermined period of time does not occur.

What is claimed is:
1. A non-linear signal receiver for detecting an original data $a_k$ from an input signal r(t) which is a binary data stream input through a channel or reproduced from data recorded on a storing device, the receiver comprising:

an analog-to-digital converter (ADC) for sampling the input value according to sampling timing phases, and converting the sampled data into a digital signal $r_k$;

a modeling portion including 2N+1 taps $P_n$ (n=−N, ..., 0, ..., N) each for selecting one of $2^{\tau+\nu}$ tap values according to each pattern $P_n$ ($b_{k−n+\nu:k−n+1}$, $b_{k−n−1:k−n−\tau}$) of absolute values of the data transitions future $\nu$ bits and past $\tau$ bits, for estimating the channel characteristics of the sampled signal from the selected tap value and the data transition value;

a timing recovery portion for controlling the sampling timing phase of the analog-to-digital converter using a phase gradient which is the difference between values of respective taps positioned symmetrically around the tap $P_0$ of the modeling portion;

an equalizer for compensating for the deteriorated characteristics of the output value of the analog-to-digital converter; and a detector for converting the output of the equalizer to a digital value, to detect the original signal.

2. The non-linear signal receiver of claim 1, wherein the phase gradient is equal to $p_1(0)−p_{−1}(0)$.

3. The non-linear signal receiver of claim 1, wherein the modeling portion comprises:

2N+1 taps for selecting one among $2^{\tau+\nu}$ pulses $p_n$ ($b_{k−n+\nu:k−n+1}$, $b_{k−n−1:k−n−\tau}$) according to the states of the transition $b_{k−n+\nu:k−n+1}$ of future $\nu$ bits and the transition $b_{k−n−1:k−n−\tau}$ of past $\tau$ bits in the respective samples n, and outputting the product of the selected value and the data transition value; and an adder for calculating the sum of the outputs of each tap.

4. The non-linear signal receiver of claim 1, wherein the pulses $p_n(\cdot)$ are updated such that the mean square of an error which is the difference between the input value $r_k$ and the output value of the adder is minimized.

5. The non-linear signal receiver of claim 1, wherein each tap selects one among $2^{\tau+\nu+1}$ values in consideration of the current data $c_k$ in addition to the future $\nu$ bits and past $\tau$ bits, wherein the current data $c_k$ is 1 if the original data $a_k$ is greater than 0, and otherwise the current data $c_k$ is 0.

6. The non-linear signal receiver of claim 1, wherein the timing recovery portion calculates a (k+1)th frequency difference $\Delta_{k+1}$ between the input signal r(t) and a local timing source for sampling the input signal r(t), and a (k+1)th timing phase $\xi_{k+1}$ using the following equation:

$$\Delta_{k+1} = \Delta_k + \beta \cdot z_k$$

$$\xi_{k+1} = \xi_k + \alpha \cdot z_k + \Delta_{k+1}$$

wherein $\alpha$ and $\beta$ represents step sizes and $z_k$ represents the kth phase gradient.

* * * * *